(12) United States Patent
Wert

(10) Patent No.: US 6,906,553 B1
(45) Date of Patent: Jun. 14, 2005

(54) CIRCUITRY FOR PROVIDING OVERVOLTAGE BACKDRIVE PROTECTION

(75) Inventor: Joseph D. Wert, Arlington, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 1 day.

(21) Appl. No.: 10/440,033

(22) Filed: May 16, 2003

(51) Int. Cl.$^7$ .......................................... H03K 19/0185
(52) U.S. Cl. ............................. 326/81; 326/80; 326/68
(58) Field of Search ............................. 326/62, 63, 68, 326/80, 81

(56) References Cited

U.S. PATENT DOCUMENTS 5,929,667 A * 7/1999 Abadeer et al. ............ 327/112
6,081,412 A     6/2000 Duncan et al.
6,323,704 B1 * 11/2001 Pelley et al. ................ 327/112
6,437,958 B1    8/2002 Duncan et al.

* cited by examiner

Primary Examiner—Anh Q. Tran

(57) ABSTRACT

A logic gate for use in an electronic system comprising: i) a first component operating from a low voltage power supply rail; ii) a second component operating from a high voltage power supply rail; and iii) an over-voltage protection circuit that detects an over-voltage on an output pad of the first component and, in response to the detection generates from the over-voltage a generated power supply voltage and a generated reference signal. According to an advantageous embodiment of the present invention, the logic gate comprises a plurality of transistors, wherein the plurality of transistors are powered by the generated power supply voltage and at least one of the plurality of transistors is turned ON and OFF by the generated reference signal.

18 Claims, 2 Drawing Sheets

CIRCUITRY FOR PROVIDING OVERVOLTAGE BACKDRIVE PROTECTION

TECHNICAL FIELD OF THE INVENTION

The present invention is related to over-voltage protection and, in particular, to logic circuits operating from an output driver that prevents reverse charge leakage and gate oxide breakdown when the voltage on the driver output exceeds the driver internal power supply voltage or when the driver is powered down.

BACKGROUND OF THE INVENTION

Many modern electronic devices contain components that operate from different power supply voltages. For example, in a laptop computer, the data processor module may be powered by a +3.3 volt power supply while the disk drive(s) may be powered by a +5.0 volt power supply. This difference in operating conditions may cause problems for the module using the lower power supply voltage, particularly if the modules are coupled by a common bus. A condition known as reverse charge leakage occurs when a module applies a voltage to a common bus and the voltage creates a charge leakage path from the bus to the power supply of a module operating at a lower power supply voltage.

For instance, a +3.3 volt module using a PMOS pull-up transistor at its output to a bus applies a +3.3 volt gate voltage to turn off the PMOS transistor. However, if the bus is raised to +5.0 volts by a commonly connected +5.0 volt module, the PMOS transistor may be turned on, providing a conductive path from the bus to the +3.3 volt power supply rail. Since the back-gate of the +3.3 volt PMOS transistor is typically tied to +3.3 volts as well, the drain/back-gate diode of the device provides another conductive channel.

Another problem that occurs with modules operating under different power supply voltages is the potential for gate oxide breakdown when the low-power module is powered down (i.e., when the power supply is at 0 volts). For instance, in a +3.3 volt process, the maximum voltage allowed from the gate to the source or from the gate to the drain in any device is 4.6 volts. The maximum gate to back-gate voltage is 5.3 V. A +5.0 volt signal appearing on a common bus when the +3.3 volt module is powered down can create gate oxide voltages exceeding the 4.6 V level, leading to device failure.

U.S. Pat. No. 5,555,149, issued Sep. 10, 1996 to Wert et al., discloses an output buffer that prevents reverse charge leakage by using isolation transistors to block potential leakage paths. However, when the invention disclosed in U.S. Pat. No. 5,555,149 is powered down, it provides no protection against gate oxide breakdown. The teachings of U.S. Pat. No. 5,555,149 are hereby incorporated by reference into the present disclosure as if fully set forth herein.

U.S. Pat. No. 6,081,412, issued Jun. 27, 2000 to Wert et al., discloses an output driver protection circuit that avoids reverse charge leakage while preventing excessive gate oxide voltage development when powered down. The teachings of U.S. Pat. No. 6,081,412 are hereby incorporated by reference into the present disclosure as if fully set forth herein.

FIG. 1 illustrates prior art output driver circuit 100, which is illustrated and described in U.S. Pat. No. 6,081,412. Output driver circuit 100 generates a first reference voltage at node A at the output of transistor 125 and a second reference voltage at node C at the output of transistor 126.

As is explained in greater detail in U.S. Pat. No. 6,081,412, the output driver protection circuit always provides power at node A. Under normal operating conditions, the voltage at node A of output driver circuit 100 is VDD (e.g., +3.3 volts). Under over-voltage conditions, the voltage at node A is equal to the PAD voltage minus some voltage drop determined by transistors 121–125. Under normal operating conditions, the voltage at node C of output driver circuit 100 is 0 volts. Under over-voltage conditions, the voltage at node C is equal to the voltage at node A.

In some electronic circuit designs, it may be necessary to provide additional protection by implementing protective logic gates that operate under over-voltage conditions and when the low power supply is zero volts. Preferably, these protective logic gates are capable of operating from the voltages provided by node A and node C in output driver circuit 100.

SUMMARY OF THE INVENTION

To address the above-discussed deficiencies of the prior art, it is a primary object of the present invention to provide a logic gate for use in an electronic system comprising: i) a first component operating from a low voltage power supply rail; ii) a second component operating from a high voltage power supply rail; and iii) an over-voltage protection circuit that detects an over-voltage on an output pad of the first component and, in response to the detection generates from the over-voltage a generated power supply voltage and a generated reference signal. According to an advantageous embodiment of the present invention, the logic gate comprises a plurality of transistors, wherein the plurality of transistors are powered by the generated power supply voltage and at least one of the plurality of transistors is turned ON and OFF by the generated reference signal.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 2A:
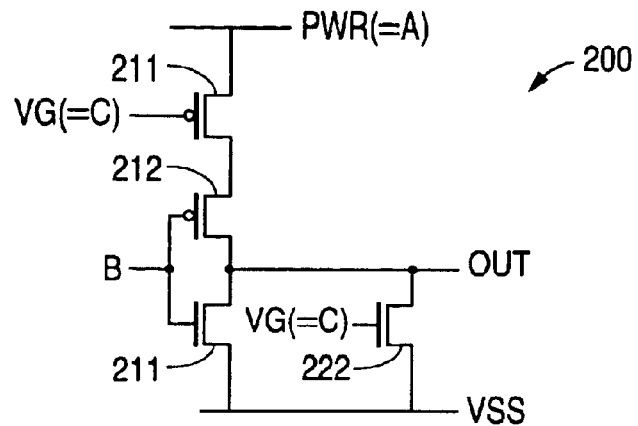
FIG. 2A illustrates a NOR gate that operates with the prior art output driver circuit of FIG. 1 according to the principles of the present invention.
Figure 2B:
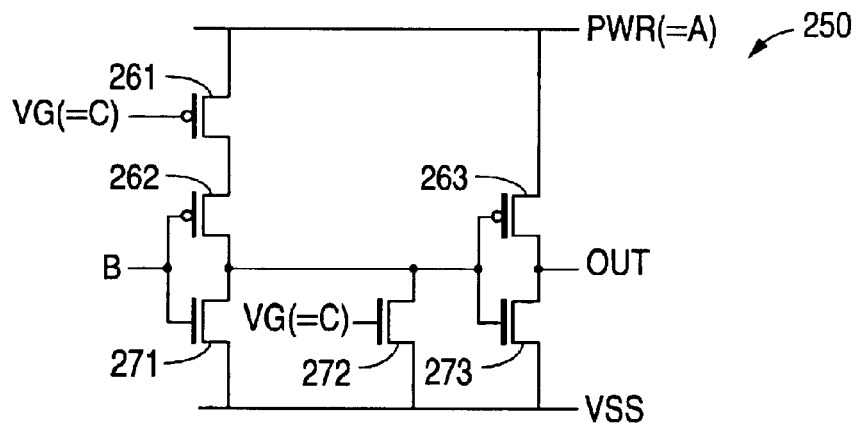
FIG. 2B illustrates an OR gate that operates with the prior art output driver circuit of FIG. 1 according to the principles of the present invention.
Figure 3:
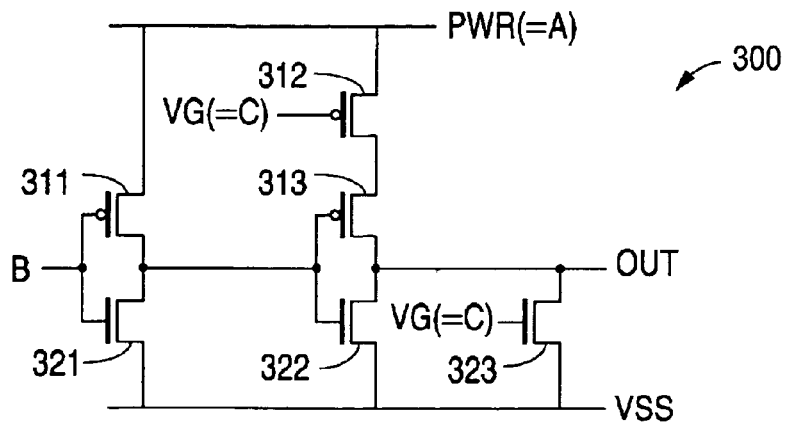
FIG. 3 illustrates an inverted input NOR gate that operates with the prior art output driver circuit of FIG. 1 according to the principles of the present invention.

FIGS. 2A, 2B and 3, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged network interface card.

Figure 1:
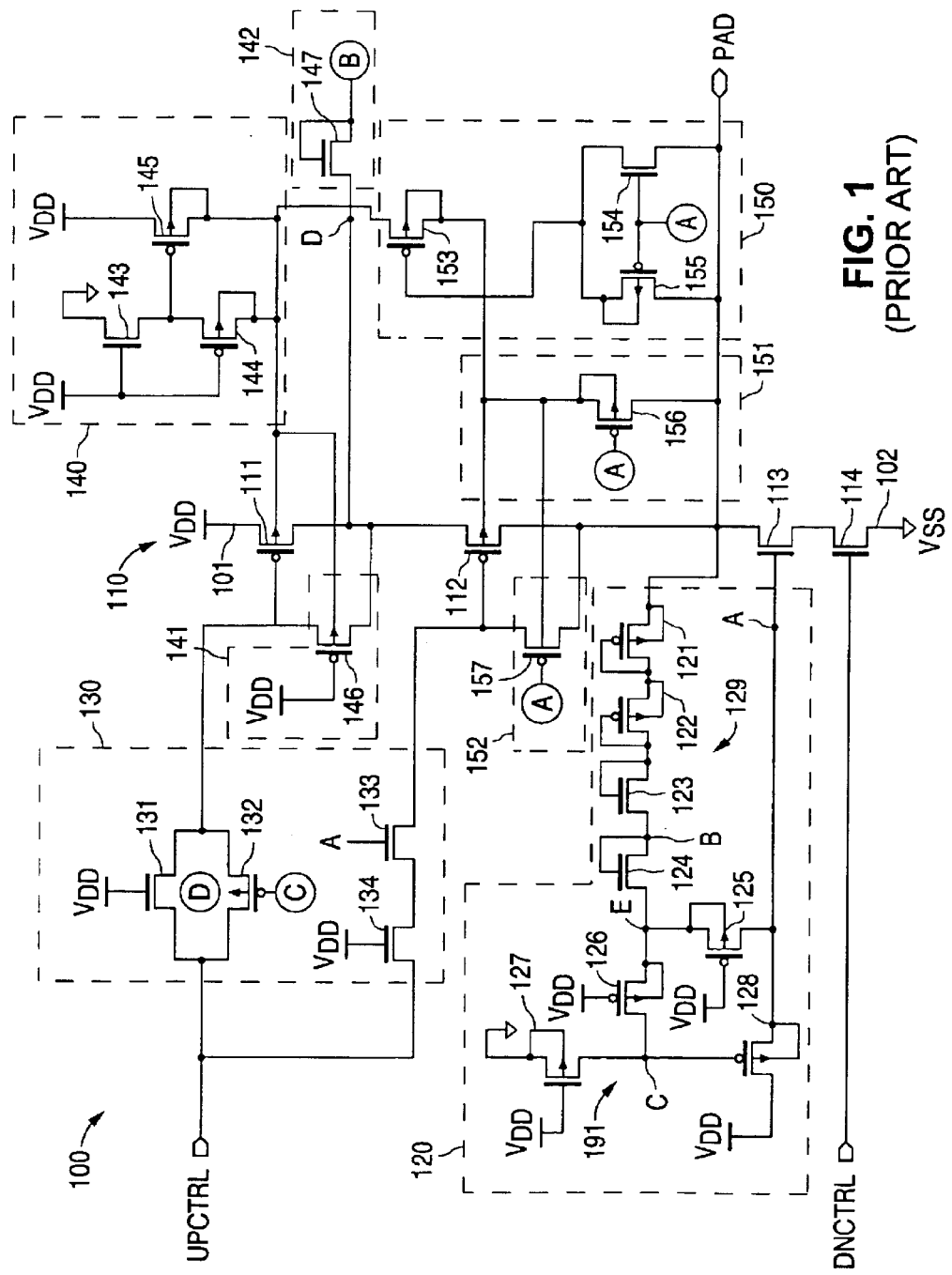
FIG. 1 illustrates an output driver circuit according to the principles of the prior art.

FIG. 2A illustrates NOR gate 200, which operates with output driver circuit 100 in FIG. 1 according to the principles of the present invention. NOR gate 200 comprises p-channel transistor 211, p-channel transistor 212, n-channel transistor 221 and n-channel transistor 222. Transistors 211, 212, 221 and 222 operate from the PWR power rail and the VSS power rail. The PWR power rail of NOR gate 200 is connected to the source of p-channel transistor 211 and to node A in output driver circuit 100. The VSS power rail is coupled to ground (or another reference voltage) and to the sources of n-channel transistors 221 and 222. The VG nodes in NOR gate 200 are connected to node C in output driver circuit 100 and to the gates of p-channel transistor 211 and n-channel transistor 222. The output OUT is coupled to the drains of transistors 212, 221 and 222.

Hence, under normal conditions, the PWR power supply rail (=A) is at VDD (e.g., +3.3 volts) and, under over-voltage conditions, the voltage at node A is equal to the PAD voltage minus some voltage drop determined by transistors 121–125 in FIG. 1. Also, under normal conditions, the voltages at the VG nodes (=C) are 0 volts and, under over-voltage conditions, the VG nodes are equal to the voltage at node A.

P-channel transistor 212 and N-channel transistor 221 form an inverter. Under normal conditions, the PWR supply rail is VDD and VG=0. This means transistor 211 is ON and transistor 222 if OFF. Thus, under normal conditions, input B appears inverted at the output OUT. Under over-voltage conditions, in which the PAD voltage in output driver circuit 100 is greater than VDD (and VDD may be 0), VG=PWR=node A in output driver circuit 100. Since VG=PWR, transistor 222 is ON, transistor 211 is OFF, the output OUT is pulled to VSS (i.e., 0 volts) and the input B is irrelevant.

The truth table for NOR gate 200 is:

| B | VG | OUT | Conditions |
|---|----|-----|------------|
| 0 | 0  | 1   | Normal     |
| 1 | 0  | 0   | Normal     |
| X | 1  | 0   | Over-voltage |

FIG. 2B illustrates OR gate 250, which operates with output driver circuit 100 of FIG. 1 according to the principles of the present invention. OR gate 250 comprises p-channel transistor 261, p-channel transistor 262, p-channel transistor 263, n-channel transistor 271, n-channel transistor 272 and n-channel transistor 273. Transistors 261–263 and 271–273 operate between the PWR power rail and the VSS power rail. The PWR power rail of OR gate 250 is connected to node A in output driver circuit 100 and to the sources of p-channel transistors 261 and 263. The VSS power rail is coupled to ground (or another reference voltage) and to the sources of n-channel transistors 271–273. The VG nodes in OR gate 250 are connected to node C in output driver circuit 100. The output OUT is coupled to the drains of transistors 263 and 273.

Hence, under normal conditions, the PWR power supply rail (=A) is at VDD (e.g., +3.3 volts) and, under over-voltage conditions, the voltage at node A is equal to the PAD voltage minus some voltage drop determined by transistors 121–125 in FIG. 1. Also, under normal conditions, the voltages at the VG nodes (=C) are 0 volts and, under over-voltage conditions, the VG nodes are equal to the voltage at node A.

P-channel transistors 261 and 262 and N-channel transistors 271 and 272 form a NOR gate. P-channel transistor 263 and N-channel transistor 273 invert the output of the NOR gate to provide the OR function. Under normal conditions, the PWR supply rail is VDD and VG=0. This means transistor 261 is ON and transistor 272 if OFF. Thus, under normal conditions, input B appears at the output OUT. Under over-voltage conditions, in which the PAD voltage in output driver circuit 100 is greater than VDD (and VDD may be 0), VG=PWR=node A in output driver circuit 100. Since VG=PWR, transistor 272 is ON, transistor 261 is OFF, the output OUT is pulled to the PWR rail, and the input B is irrelevant.

Thus, a truth table for OR gate 250 is:

| B | VG | OUT | Conditions |
|---|----|-----|------------|
| 0 | 0  | 0   | Normal     |
| 1 | 0  | 1   | Normal     |
| X | 1  | 1   | Over-voltage |

FIG. 3 illustrates inverted input NOR gate 300, which operates with output driver circuit 100 of FIG. 1 according to the principles of the present invention. Inverted input NOR gate 300 comprises p-channel transistor 311, p-channel transistor 312, p-channel transistor 313, n-channel transistor 321, n-channel transistor 322, and n-channel transistor 323. The PWR power rail of inverted input NOR gate 300 is connected to node A in output driver circuit 100. The VSS power rail is coupled to ground or another reference voltage. The VG nodes in inverted input NOR gate 300 are connected to node C in output driver circuit 100.

Hence, under normal conditions, the PWR power supply rail (=A) is at VDD (e.g., +3.3 volts) and, under over-voltage conditions, the voltage at node A is equal to the PAD voltage minus some voltage drop determined by transistors 121–125 in FIG. 1. Also, under normal conditions, the voltages at the VG nodes (=C) are 0 volts and, under over-voltage conditions, the VG nodes are equal to the voltage at node A.

P-channel transistors 312 and 313 and N-channel transistor 322 and 323 form a NOR gate. P-channel transistor 311 and N-channel transistor 321 invert the input B. Under normal conditions, the PWR supply rail is VDD and VG=0. This means transistor 312 is ON and transistor 323 if OFF. Thus, under normal conditions, input B appears at the output OUT. Under over-voltage conditions, in which the PAD voltage in output driver circuit 100 is greater than VDD (and VDD may be 0), VG=PWR=node A in output driver circuit 100. Since VG=PWR, transistor 323 is ON and transistor 312 is OFF, the output OUT is pulled to VSS (i.e., 0 volts), and the input B is irrelevant.

The truth table for inverted input NOR gate 300 is:

| B | VG | OUT | Conditions |
|---|----|-----|------------|
| 0 | 0  | 0   | Normal     |
| 1 | 0  | 1   | Normal     |
| X | 1  | 0   | Over-voltage |

The over-voltage protection circuitry of output driver circuit 100 generates at node A the generated power supply voltage, PWR, using the over-voltage on the PAD output in FIG. 1. The over-voltage protection circuitry of output driver circuit 100 also generates at node C the reference signal, VG, from the over-voltage on the PAD output in FIG. 1. Each one of NOR gate 200, OR gate 250 and inverted input NOR gate 300 is capable of operating under over-voltage (or back-drive) conditions from the generated power supply voltage, PWR, and from the generated reference signal, VG. The OUT signal from each one of NOR gate 200, OR gate 250 and inverted input NOR gate 300 may therefore be used under over-voltage conditions to enable (or disable) other gates in an electronic device during over-voltage conditions.

Although the present invention has been described with an exemplary embodiment, various changes and modifications may be suggested to one skilled in the art. It is intended that the present invention encompass such changes and modifications as fall within the scope of the appended claims.

What is claimed is:

1. A logic gate for use in an electronic system comprising: i) a first component operating from a low voltage power supply rail; ii) a second component operating from a high voltage power supply rail; and iii) an over-voltage protection circuit that detects an over-voltage on an output pad of said first component and, in response to said detection, generates from the over-voltage a generated power supply voltage and a generated reference signal, said logic gate comprising a plurality of transistors, wherein said plurality of transistors are powered by said generated power supply voltage and wherein said generated reference signal turns on and turns off at least a first one of said plurality of transistors.

2. The logic gate as set forth in claim 1 wherein said generated reference signal turns on said first transistor to thereby set an output of said logic gate to a low voltage during an over-voltage condition.

3. The logic gate as set forth in claim 1 wherein said generated reference signal turns on said first transistor to thereby set an output of said logic gate to a high voltage during an over-voltage condition.

4. A logic gate for use in an electronic system comprising: i) a first component operating from a low voltage power supply rail; ii) a second component operating from a high voltage power supply rail; and iii) an over-voltage protection circuit that detects an over-voltage on an output pad of said first component and, in response to said detection, generates from the over-voltage a generated power supply voltage and a generated reference signal, said logic gate comprising:

a first n-channel transistor having a gate coupled to an input signal, a source coupled to a VSS supply rail, and a drain coupled to an output of said logic gate;

a second n-channel transistor having a gate coupled to said generated reference signal, a source coupled to said VSS supply rail, and a drain coupled to said output of said logic gate;

a first p-channel transistor having a gate coupled to said input signal, a drain coupled to said output of said logic gate, and a source; and a second p-channel transistor having a gate coupled to said generated reference signal, a source coupled to said generated power supply voltage, and a drain coupled to said source of said first p-channel transistor.

5. The logic gate as set forth in claim 4 wherein said generated reference signal turns on said second n-channel transistor to thereby set said output of said logic gate to a low voltage during an over-voltage condition.

6. A logic gate for use in an electronic system comprising: i) a first component operating from a low voltage power supply rail; ii) a second component operating from a high voltage power supply rail; and iii) an over-voltage protection circuit that detects an over-voltage on an output pad of said first component and, in response to said detection, generates from the over-voltage a generated power supply voltage and a generated reference signal, said logic gate comprising:

a first n-channel transistor having a gate coupled to an input signal, a source coupled to a VSS supply rail, and a drain;

a second n-channel transistor having a gate coupled to said generated reference signal, a source coupled to said VSS supply rail, and a drain coupled to said drain of said first n-channel transistor;

a third n-channel transistor having a gate coupled to said drains of said first and second n-channel transistors, a source coupled to said VSS supply rail, and a drain coupled to an output of said logic gate;

a first p-channel transistor having a gate coupled to said input signal, a drain coupled to said drains of said first and second n-channel transistors, and a source; a second p-channel transistor having a gate coupled to said generated reference signal, a source coupled to said generated power supply voltage, and a drain coupled to said source of said first p-channel transistor; and a third p-channel transistor having a gate coupled to said drains of said first and second n-channel transistors, a source coupled to said generated power supply voltage, and a drain coupled to said output of said logic gate.

7. The logic gate as set forth in claim 6 wherein said generated reference signal turns on said second n-channel transistor to thereby set said output of said logic gate to a high voltage during an over-voltage condition.

8. A logic gate for use in an electronic system comprising: i) a first component operating from a low voltage power supply rail; ii) a second component operating from a high voltage power supply rail; and iii) an over-voltage protection circuit that detects an over-voltage on an output pad of said first component and, in response to said detection, generates from the over-voltage a generated power supply voltage and a generated reference signal, said logic gate comprising:

a first n-channel transistor having a gate, a source coupled to a VSS supply rail, and a drain coupled to an output of said logic gate;

a second n-channel transistor having a gate coupled to said generated reference signal, a source coupled to said VSS supply rail, and a drain coupled to said output of said logic gate;

a third n-channel transistor having a gate coupled to an input signal, a source coupled to said VSS supply rail, and a drain coupled to said gate of said first n-channel transistor;

a first p-channel transistor having a gate coupled to gate of said first n-channel transistor, a drain coupled to said output of said logic gate, and a source;

a second p-channel transistor having a gate coupled to said generated reference signal, a source coupled to said generated power supply voltage, and a drain coupled to said source of said first p-channel transistor; and a third p-channel transistor having a gate coupled to said input signal, a source coupled to said generated power supply voltage, and a drain couples to said gate of said first p-channel transistor.

9. The logic gate as set forth in claim 8 wherein said generated reference signal turns on said second n-channel transistor to thereby set said output of said logic gate to a low voltage during an over-voltage condition.

10. An electronic system comprising:
a first component operating from a low voltage power supply rail;
a second component operating from a high voltage power supply rail;
an over-voltage protection circuit that detects an over-voltage on an output pad of said first component and, in response to said detection, generates from the over-voltage a generated power supply voltage and a generated reference signal; and
a logic gate comprising a plurality of transistors, wherein said plurality of transistors are powered by said generated power supply voltage and wherein said generated reference signal turns on and turns off at least a first one of said plurality of transistors.

11. The electronic system as set forth in claim 10 wherein said generated reference signal turns on said first transistor to thereby set an output of said logic gate to a low voltage during an over-voltage condition.

12. The electronic system as set forth in claim 10 wherein said generated reference signal turns on said first transistor to thereby set an output of said logic gate to a high voltage during an over-voltage condition.

13. An electronic system comprising:
a first component operating from a low voltage power supply rail;
a second component operating from a high voltage power supply rail;
an over-voltage protection circuit that detects an over-voltage on an output pad of said first component and, in response to said detection, generates from the over-voltage a generated power supply voltage and a generated reference signal; and
a logic gate comprising:
a first n-channel transistor having a gate coupled to an input signal, a source coupled to a VSS supply rail, and a drain coupled to an output of said logic gate;
a second n-channel transistor having a gate coupled to said generated reference signal, a source coupled to said VSS supply rail, and a drain coupled to said output of said logic gate;
a first p-channel transistor having a gate coupled to said input signal, a drain coupled to said output of said logic gate, and a source; and
a second p-channel transistor having a gate coupled to said generated reference signal, a source coupled to said generated power supply voltage, and a drain coupled to said source of said first p-channel transistor.

14. The electronic system as set forth in claim 13 wherein said generated reference signal turns on said second n-channel transistor to thereby set said output of said logic gate to a low voltage during an over-voltage condition.

15. An electronic system comprising:
a first component operating from a low voltage power supply rail;
a second component operating from a high voltage power supply rail;
an over-voltage protection circuit that detects an over-voltage on an output pad of said first component and, in response to said detection, generates from the over-voltage a generated power supply voltage and a generated reference signal; and
a logic gate comprising:
a first n-channel transistor having a gate coupled to an input signal, a source coupled to a VSS supply rail, and a drain;
a second n-channel transistor having a gate coupled to said generated reference signal, a source coupled to said VSS supply rail, and a drain coupled to said drain of said first n-channel transistor;
a third n-channel transistor having a gate coupled to said drains of said first and second n-channel transistors, a source coupled to said VSS supply rail, and a drain coupled to an output of said logic gate;
a first p-channel transistor having a gate coupled to said input signal, a drain coupled to said drains of said first and second n-channel transistors, and a source;
a second p-channel transistor having a gate coupled to said generated reference signal, a source coupled to said generated power supply voltage, and a drain coupled to said source of said first p-channel transistor; and
a third p-channel transistor having a gate coupled to said drains of said first and second n-channel transistors, a source coupled to said generated power supply voltage, and a drain coupled to said output of said logic gate.

16. The electronic system as set forth in claim 15 wherein said generated reference signal turns on said second n-channel transistor to thereby set said output of said logic gate to a high voltage during an over-voltage condition.

17. An electronic system comprising:
a first component operating from a low voltage power supply rail;
a second component operating from a high voltage power supply rail;
an over-voltage protection circuit that detects an over-voltage on an output pad of said first component and, in a response to said detection, generates from the over-voltage a generated power supply voltage and a generated reference signal; and
a logic gate comprising:
a first n-channel transistor having a gate, a source coupled to a VSS supply rail, and a drain coupled to an output of said logic gate;
a second n-channel transistor having a gate coupled to said generated reference signal, a source coupled to said VSS supply rail, and a drain coupled to said output of said logic gate;
a third n-channel transistor having a gate coupled to an input signal, a source coupled to said VSS supply rail, and a drain coupled to said gate of said first n-channel transistor;
a first p-channel transistor having a gate coupled to gate of said first n-channel transistor, a drain coupled to said output of said logic gate, and a source;
a second p-channel transistor having a gate coupled to said generated reference signal, a source coupled to said generated power supply voltage, and a drain coupled to said source of said first p-channel transistor; and
a third p-channel transistor having a gate coupled to said input signal, a source coupled to said generated power supply voltage, and a drain couples to said gate of said first p-channel transistor.

18. The electronic system as set forth in claim 17 wherein said generated reference signal turns on said second n-channel transistor to thereby set said output of said logic gate to a low voltage during an over-voltage condition.

* * * * *